United States Patent [19]
Honda et al.

[11] Patent Number: 5,495,223
[45] Date of Patent: Feb. 27, 1996

[54] HYBRID INTEGRATED CIRCUIT DEVICE

[75] Inventors: Ziro Honda, Itami; Takashi Takahashi, Kawanishi, both of Japan

[73] Assignee: Mitsubishi Denki Kabushiki Kaisha, Tokyo, Japan

[21] Appl. No.: 168,184

[22] Filed: Dec. 17, 1993

[30] Foreign Application Priority Data

Dec. 18, 1992 [JP] Japan .................. 4-339013

[51] Int. Cl.⁶ ............................. H01C 1/144
[52] U.S. Cl. ................. 338/329; 338/306; 338/332
[58] Field of Search ................. 338/306, 329, 338/332

[56] References Cited

U.S. PATENT DOCUMENTS

| H498 | 7/1988 | Keller et al. | 338/329 X |
| 4,991,059 | 2/1991 | Kiyase | 338/329 X |

FOREIGN PATENT DOCUMENTS

| 61-203506 | 12/1986 | Japan . |
| 63-72921 | 5/1988 | Japan . |
| 63-89226 | 6/1988 | Japan . |
| 32 | 1/1991 | Japan . |
| 323916 | 3/1991 | Japan . |

*Primary Examiner*—Marvin M. Lateef
*Attorney, Agent, or Firm*—Leydig, Voit & Mayer

[57] ABSTRACT

A hybrid integrated circuit device includes a circuit board having at least two electrical conductors; a chip resistor bridgingly disposed across two of the electrical conductors of the circuit board; and solder electrically connecting the chip resistor to the two electrical conductors. The chip resistor has an electrically insulating substrate, two electrodes disposed on the electrically insulating substrate, separated from each other, and each electrode has a contact end electrically contacting the electrical conductors of the circuit board and a resistor element disposed on the electrically insulating substrate and electrically connected to the contact ends of the electrodes. The solder electrically connects the electrodes of the chip resistor to the electrical conductors of the circuit board.

5 Claims, 4 Drawing Sheets

HYBRID INTEGRATED CIRCUIT DEVICE

BACKGROUND OF THE INVENTION

This invention relates to a hybrid integrated circuit device and, more particularly, to a hybrid integrated circuit device in which a chip resistor is disposed on a thick film circuit board and electrically connected thereto by a solder.

FIG. 9 is a fragmental plan view of a known hybrid integrated circuit device and FIG. 10 is a sectional view taken along line X—X of FIG. 9. As illustrated in FIGS. 9 and 10, a chip resistor 3 comprises an electrically insulating substrate 3a made, for example, of ceramic, two electrodes 5 disposed at opposite ends of the electrically insulating substrate 3a and a resistor element 4 disposed on the top surface of the electrically insulating substrate 3a and electrically connected to the electrodes 5. The resistor element 4 is made of a resistance material having a small electrical resistance of the order of mΩ.

As seen from FIGS. 9 and 10, two electrical conductors 2 are disposed on a thick film circuit board 1 so that each can be contacted to the electrodes 5 of the chip resistor 3. The chip resistor 3 is mounted on the circuit board 1 and the electrodes 5 of the chip resistor 3 are electrically connected to the electrical conductors 2 by means of solder 6.

In the known hybrid integrated circuit device as described above, the chip resistor 3 having the resistor element 4 is electrically connected to the electrical conductors 2 which disposed on the circuit board 1 through the solder 6 so as to form a resistance on the circuit board 1 as well as through the direct contact surface of the electrode 5. That is, electrical current which flows between the electrical conductor 2 and the electrode 5 flows through two routes, one including the solder 6 and the other not including the solder 6. Therefore, the total resistance between the conductors 2 is determined by the resistances of the two routes connected in parallel, one of which is through the solder 6 and the electrode 5 and the other of which is only through the electrode 5.

In the known hybrid integrated circuit device as described above, when undesirable stresses due to thermal stresses, applied to the connecting portions between the solder 6 and the chip resistor 3, shearing, tension and/or compression can occur and, further, cracks 7 might happen to be generated as illustrated in FIG. 11. When cracks 7 occur between the solder 6 and the electrodes 5, one of the current routes which extends from the electrical conductor 2 to the electrode 5 through the solder 6 becomes almost interrupted. Therefore, the resistance between the electrical conductor 2 and the resistor element 4 becomes merely that of the electrode 5 which is in direct contact with the conductor 2 and the total resistance between the conductors 2 is also changed, resulting in unreliable electrical characteristics. Further, as the resistance of the resistor element 4 is very small, the cracks 7 have a significant harmful influence upon the total resistance.

SUMMARY OF THE INVENTION

Accordingly, one object of the present invention is to provide a hybrid integrated circuit device free from the above-discussed problems of the known hybrid integrated circuit device.

Another object of the present invention is to provide a hybrid integrated circuit device which is durable.

A further object of the present invention is to provide a hybrid integrated circuit device in which electrical characteristics can be prevented from changing.

Another object of the present invention is to provide a hybrid integrated circuit device which has a high electrical reliability.

With the above objects in view, the hybrid integrated circuit device of the present invention comprises a circuit board having at least two electrical conductors thereon, a chip resistor bridgingly disposed across the two electrical conductors of the circuit board and a solder electrically connecting the chip resistor to two of the electrical conductors. The chip resistor has an electrically insulating substrate, two electrodes disposed on the electrically insulating substrate and separated from each other and each having a contact end directly and electrically contacting the electrical conductor of the circuit board and a resistor element disposed on the electrically insulating substrate and electrically connected between the contact ends of the electrodes. Further, the solder electrically connects the electrodes of the chip resistor to the electrical conductors of the circuit board.

BRIEF DESCRIPTION OF THE DRAWINGS

The present invention will become more readily apparent from the following detailed description of the preferred embodiments of the present invention taken in conjunction with the accompanying drawings, in which.

DESCRIPTION OF THE PREFERRED EMBODIMENTS

Figure 1:
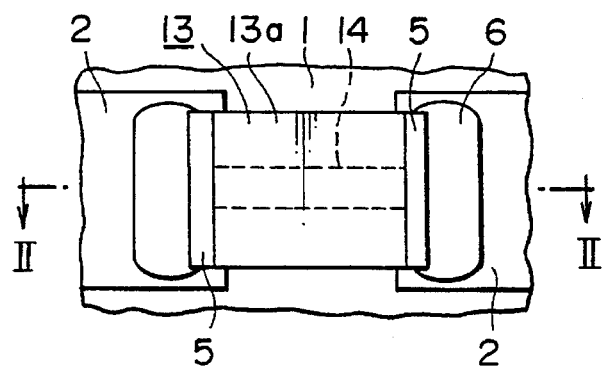
FIG. 1 is a fragmental plan view of an embodiment of the hybrid integrated circuit device of the present invention.
Figure 2:
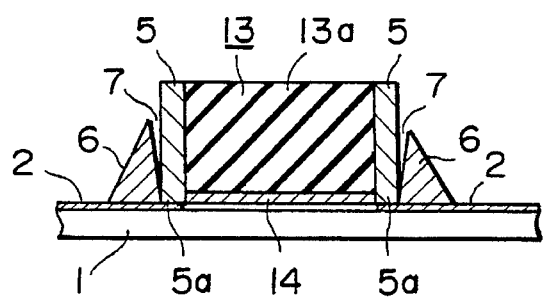
FIG. 2 is a sectional view taken along line II—II of FIG. 1.

FIG. 1 illustrates in a fragmental plan view of an embodiment of a hybrid integrated circuit device of the present invention and FIG. 2 is a sectional view taken along line II—II of FIG. 1. A chip resistor 13 comprises an electrically insulating substrate 13a made, for example, of ceramic. Two electrodes 5 are disposed at opposite side surfaces of the electrically insulating substrate 13a, separated from each other, each having a contact end 5a for directly and electrically contacting the electrical conductors 2 on the circuit board 1. A resistor element 14 is disposed only on the bottom surface of the electrically insulating substrate 13a and is electrically connected to the contact ends 5a of the electrodes 5.

Disposed on the circuit board 1 are two electrical conductors 2 fixed thereto in a suitable manner such as a printing method and connected to the electrodes 5 of the chip resistor 13. In manufacture, after the solder 6 is printed on the electrical conductors 2, the chip resistor 13 is disposed on the solder 6 so that the chip resistor 13 is bridgingly disposed across two of the electrical conductors 2 of the circuit board 1 and the contact ends 5a of the electrodes 5 of the chip resistor 13 are electrically contacted and connected to the electrical conductors 2. Further, the solders 6 is melted by heating and cooled and hardened to electrically connect the electrodes 5 of the chip resistor 13 to the electrical conductors 2 of the circuit board 1. Since the solder 6 rises along the electrodes 5 toward the upper portions of the electrodes 5 because of the solder wetting during a soldering process, it is easy to attach the solder 6 to the electrodes 5.

In the hybrid integrated circuit device of the present invention as described above, since the resistor element 14 is provided between the contact ends 5a and at the bottom surface of the chip resistor 13, the current path which extends through the electrodes 5 is short and hence the resistance of the electrodes 5 is small. Therefore, most of the current which flows between the conductor 2 and the electrode 5 flows not through the solder 6 but through the contact ends 5a of the electrodes 5 without passing through the solder 6. Even when cracks 7 are generated between the solders 6 and the electrodes 5 due to thermal stresses as illustrated in FIG. 2, since the solder 6 and the electrodes 5 usually remain in an electrically connected relationship, the cracks 7 do not have much effect on the current route and further on the total resistance. Even if the lower connecting portions between the solder 6 and the electrodes 5 are also interrupted by the cracks 7, as the quantity of the current flowing through the solders 6 is originally very small, the total resistance remains almost unchanged.

As described above, the hybrid integrated circuit of the present invention is durable against thermal stresses and the electrical characteristics thereof can be prevented from changing due to thermal stresses. Therefore, the hybrid integrated circuit device of the present invention has a high electrical reliability. Further, as the resistor element 14 is disposed on the bottom surface of the electrically insulating substrate 13a, the electrically insulating substrate 13a can be thinner and the chip resistor 13 can be compact.

Figure 3:
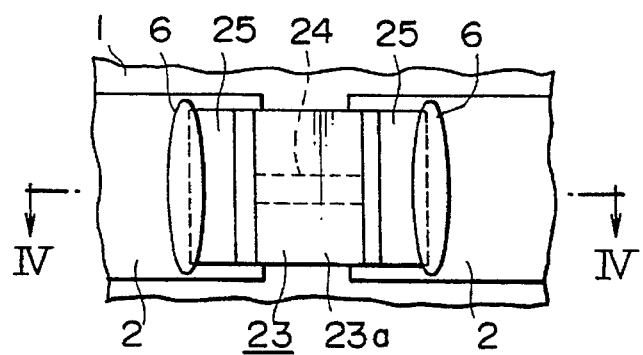
FIG. 3 is a fragmental plan view of another embodiment of the hybrid integrated circuit device of the present invention.
Figure 4:
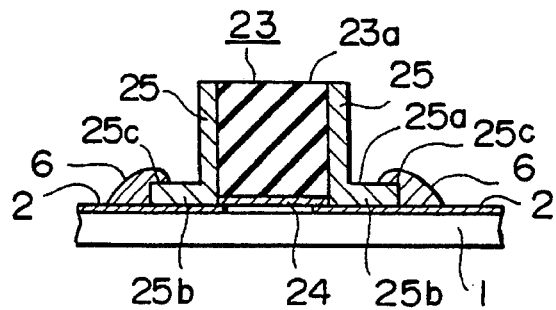
FIG. 4 is a sectional view taken along line IV—IV of FIG. 3.

FIGS. 3 and 4 illustrate another embodiment of the hybrid integrated circuit device of the present invention. As illustrated in FIGS. 3 and 4, a chip resistor 23 comprises a resistor element 24 disposed on the bottom surface of an electrically insulating substrate 23a, two electrodes 25 disposed at opposite side surfaces of the electrically insulating substrate 23a and each having a L-shaped cross section. The L-shaped electrodes 25 are electrically connected to each other only through the resistor element 24. Also, the L-shaped electrodes 25 are fixed to both of the whole side surfaces of the electrically insulating substrate 23a and each of the lower portions of the electrodes 25 is a contact end portion 25a or a projection which extends outwardly and has a contact end 25b at its bottom for directly and electrically contacting a circuit board 1 and an outside end 25c at its extended tip.

Disposed on the circuit board 1 are two electrical conductors 2 printed thereon. The chip resistor 23 is bridgingly disposed across the two electrical conductors 2 so that the contact ends 25b of the L-shaped electrodes 25 electrically contact the electrical conductors 2. The outside ends 25c of the contact end portions 25a of the L-shaped electrodes 25 are soldered with solder 6.

In this embodiment, since the L-shaped electrodes are employed, the contact ends 25b or electrically contacting the electrical conductors 2 become large. Therefore, the resistance of the electrodes 25 becomes smaller and current can easily flow therethrough. Further, since the outside ends 25c of the contact end portions 25a are soldered, the current flows not through the solder 6 but through the one of the electrical conductors 2, one of the L-shaped electrodes 25, the resistor element 24, the other L-shaped electrode 25 and the other electrical conductor 2. Therefore, the total resistance thereof is determined by resistances of the above elements in the current route and is much less sensitive to the presence of a crack between the solder 6 and the L-shaped electrodes 25. The electrical characteristics can be prevented from changing.

Further, since the solder 6 is applied to the whole surface of the contact end portions 25a including the top surface thereof so that the solder 6 completely covers the outside ends 25c of the contact end portions 25a of the electrodes 25, strong solder connections can be provided thereto and the reliability is improved.

Figure 5:
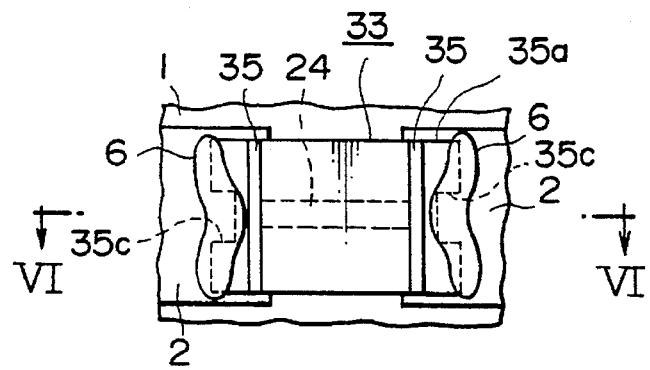
FIG. 5 is a fragmental plan view of still another embodiment of the hybrid integrated circuit device of the present invention.
Figure 6:
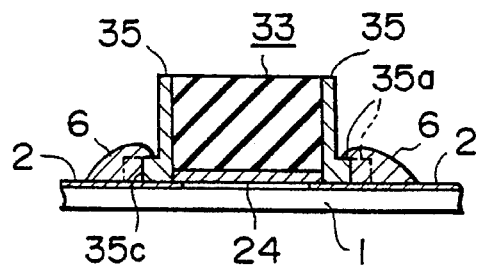
FIG. 6 is a sectional view taken along line VI—VI of FIG. 5.

FIGS. 5 and 6 illustrate another embodiment of the hybrid integrated circuit device of the present invention, which has basically the same structure as the above embodiment illustrated in FIGS. 3 and 4 but is different in electrodes 35. Each of the electrodes 35 has an L-shaped cross section and a contact end portion 35a extending outwardly similar to that of the above embodiment and also has a recess 35c at the middle of the contact end 35a. The recesses 35c are stamped out from L-shaped metal plates and extend through the entire thickness of the contact ends 35a. In this embodiment, current flows the same route as that of the above embodiment and the same advantages can be offered as the above embodiment by this embodiment. Further, since the recesses 35c are provided at the contact ends 35a of the electrodes 35, the wettability of the solders 6 can be used more efficiently. Also, as the contacting surface between the solder 6 and the electrodes 35 becomes larger, the solderability is improved and the soldering portion becomes stronger.

Figure 7:
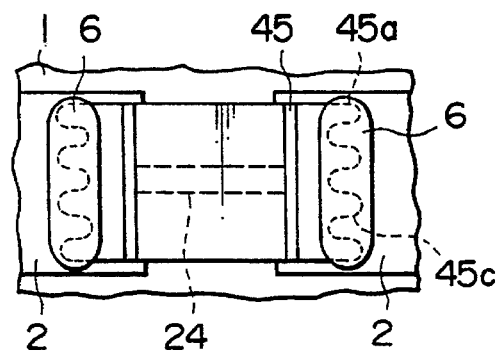
FIG. 7 is a fragmental plan view of further another embodiment of the hybrid integrated circuit device of the present invention.

FIG. 7 illustrates still another embodiment of the hybrid integrated circuit device of the present invention. In this embodiment, as illustrated in FIG. 7, each of L-shaped electrodes 45 has a corrugated or wave-shaped recess 45c in a contact end 45a, similarly to the above embodiment illustrated in FIGS. 5 and 6. Also, each of the recesses 45c is stamped out from the electrodes 45 and extends through the entire thickness of the contact ends 45a of the electrodes 45. The same advantages can be offered as the above embodiment by this embodiment.

Figure 8:
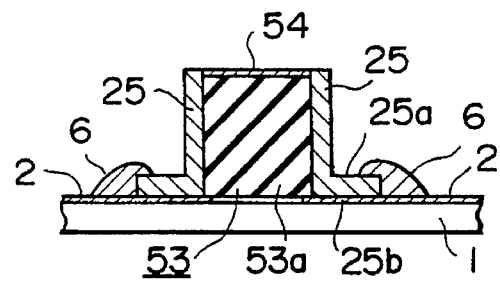
FIG. 8 is a sectional view of another embodiment of the hybrid integrated circuit device of the present invention.
Figure 9:
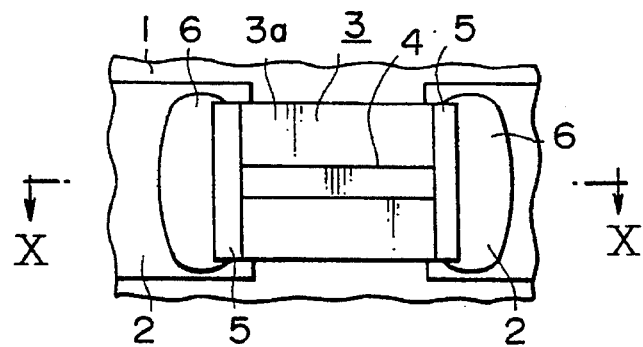
FIG. 9 is a fragmental plan view of a known hybrid integrated circuit device.
Figure 10:
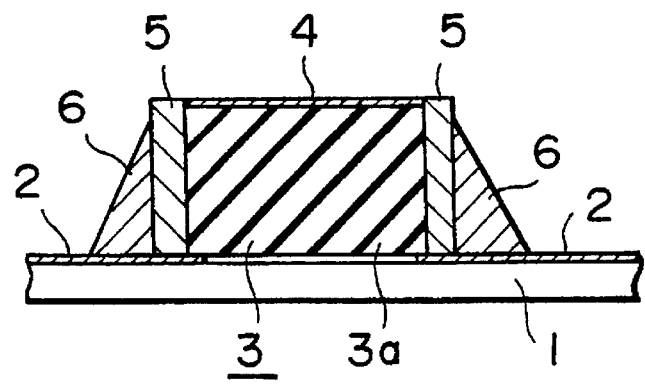
FIG. 10 is a sectional view taken along line X—X of FIG. 9.
Figure 11:
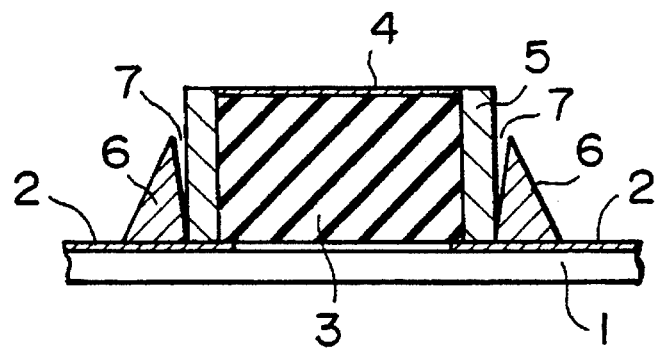
FIG. 11 is a sectional view showing the hybrid integrated circuit device of FIG. 10 in a state with undesirable cracks are generated between the solder and the electrodes.

FIG. 8 is a sectional view of another embodiment of the hybrid integrated circuit device of the present invention, which has also basically the same structure as that illustrated in FIGS. 3 and 4 but is different in a resistor element 54. In this embodiment, the resistor element 54 is disposed on the top surface of the chip resistor 53. As L-shaped electrodes 25 are employed in this embodiment, similar to the embodiment of FIGS. 3 and 4, contact ends 25b of the electrodes 25 for electrically contacting electrical conductors 2 disposed on a circuit board 1 are large. Therefore, the resistance of the electrodes 25 becomes small and current can flow easily therethrough. The current flows through the same route as that of the above embodiments and only a little current flows through also the solder 6. Hence, the total resistance is much less sensitive to the presence of cracks generated between the solder 6 and the electrodes 25 due to thermal stresses. The electrical characteristics can remain unchanged. Further, similar to the above embodiment illustrated in FIGS. 3 and 4, as the solder 6 is provided over the whole surface of each contact end 25a, a high solderability can be offered.

Also, in this embodiment, recesses may be provided, if necessary, in the contact end portions 25a of the electrodes 25, similarly to the above embodiments illustrated in FIGS. 5 and 7.

As has been described, in the hybrid integrated circuit device of the present invention, the total resistance can be prevented from changing because of the presence of cracks generated between solder and the electrodes due to thermal stresses. Therefore, the electrical characteristics can remain unchanged and a high reliability can be achieved.

Further, as the L-shaped electrodes, in which the recess may be, if necessary, provided, are employed, the soldering connection can be strong and the solderability can be improved.

What is claimed is:

1. A hybrid integrated circuit device comprising:

a circuit board including two spaced apart electrical conductors;

a chip resistor electrically connected to said two spaced apart electrical conductors on said circuit board wherein said chip resistor includes an electrically insulating substrate, a resistor element disposed on said electrically insulating substrate, two electrodes disposed on said electrically insulating substrate, said electrodes being separated from each other, each electrode having a first contact end projecting outwardly from said electrically insulating substrate and directly and electrically contacting one of said spaced apart electrical conductors on said circuit board and a second contact end perpendicular to said first contact end and electrically connected to an end of said resistor element; and solder electrically connecting said first contact ends of each electrode of said chip resistor to respective electrical conductors on said circuit board.

2. The hybrid integrated circuit device as claimed in claim 1 wherein said each first contact end has a recessed edge.

3. The hybrid integrated circuit device as claimed in claim 1 wherein said each first contact end has a serpentine edge.

4. The hybrid integrated circuit device as claimed in claim 1 wherein said resistor element is disposed between said electrically insulating substrate and said circuit board.

5. The hybrid integrated circuit device as claimed in claim 1 wherein said electrically insulating substrate is disposed between said resistor element and said circuit board.

\* \* \* \* \*